(12) United States Patent  
Bashar (10) Patent No.: US 7,973,569 B1  
(45) Date of Patent: Jul. 5, 2011

(54) OFFSET CALIBRATION AND PRECISION HYSTERESIS FOR A RAIL-RAIL COMPARATOR WITH LARGE DYNAMIC RANGE

(75) Inventor: Aniruddha Bashar, Laveen, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/726,117

(22) Filed: Mar. 17, 2010

(51) Int. Cl.  
*H03K 5/22* (2006.01)

(52) U.S. Cl. ............................................ 327/67; 327/65

(58) Field of Classification Search .................... 327/63, 327/65, 67  
See application file for complete search history.

(56) References Cited

U.S. PATENT DOCUMENTS

| | | | | |
|---|---|---|---|---|
| 4,874,969 | A * | 10/1989 | Meadows | 327/73 |
| 6,970,022 | B1 * | 11/2005 | Miller | 327/77 |
| 7,292,083 | B1 * | 11/2007 | Wang et al. | 327/205 |

* cited by examiner

*Primary Examiner* — Hai L Nguyen  
(74) *Attorney, Agent, or Firm* — King & Spalding L.L.P.

(57) ABSTRACT

A rail-rail comparator having an input stage with independent positive and negative differential voltage offset compensation tracks changes in Gm (transconductance) of the input stage. By tracking the changes in Gm (transconductance) of the input stage, hysteresis of the rail-rail comparator becomes insensitive to the input common mode voltage. A two-stage rail-rail comparator may be used for adding hysteresis to a second stage. The first stage of the two-stage rail-rail comparator operates at substantially unity gain. The second stage of the two-stage rail-rail comparator operates as a regular high gain amplifier with hysteresis. Additional circuitry tracks the Gm (transconductance) change of the first stage to make the second stage hysteresis insensitive to the input common mode voltage at the first stage. This also makes it easier to create a programmable hysteresis that is accurate over all input voltage values.

12 Claims, 7 Drawing Sheets

OFFSET CALIBRATION AND PRECISION HYSTERESIS FOR A RAIL-RAIL COMPARATOR WITH LARGE DYNAMIC RANGE

TECHNICAL FIELD

The present disclosure relates to rail-rail comparators, and more particularly, to offset calibration and precision hysteresis for a rail-rail comparator with large dynamic range.

BACKGROUND

A rail-rail comparator input stage has two types of differential-pairs that have to be offset calibrated separately. This requirement complicates the addition of precision hysteresis to the rail-rail comparator because the Gm (transconductance) of the rail-rail comparator input stage varies with input common mode voltages. As a result the hysteresis voltage becomes a variable, especially when the input common mode voltage is near the middle of the voltage rails the hysteresis becomes half the value near either rail, e.g., Vdd or common (ground).

SUMMARY

The aforementioned problem is solved, and other and further benefits achieved by tracking the change in Gm (transconductance) of the rail-rail comparator input stage and using that information in generating the hysteresis voltage. According to the teachings of this disclosure, a two-stage approach may be used for adding hysteresis to the second stage. The first stage of the rail-rail comparator operates at substantially unity gain. The second stage of the rail-rail comparator operates as a regular high gain amplifier with hysteresis. Additional circuitry tracks the Gm (transconductance) change of the first stage to make the second stage hysteresis insensitive to the input common mode voltage at the first stage. This also makes it easier to create a programmable hysteresis that is accurate over all input voltage values.

According to a specific example embodiment of this disclosure, a rail-rail comparator comprises: a first stage differential amplifier having differential inputs and differential outputs, the first stage differential amplifier having common mode input offset calibration; a second stage differential amplifier having differential inputs coupled to the differential outputs of the first stage differential amplifier, and a digital output for supplying first and second logic levels dependant upon a value of a differential voltage at the differential inputs of the first stage differential amplifier; a common mode voltage tracking circuit coupled to the first stage differential amplifier; and a hysteresis control circuit coupled to the second stage differential amplifier and the common mode voltage tracking circuit, wherein the hysteresis control circuit controls hysteresis of the second stage differential amplifier independently of the common mode voltage at the differential inputs of the first stage differential amplifier.

According to another specific example embodiment of this disclosure, a rail-rail comparator, comprises: a differential amplifier having differential inputs and a digital output for supplying first and second logic levels dependant upon a value of a differential voltage at the differential inputs of the differential amplifier, the differential amplifier having common mode input offset calibration; a common mode voltage tracking circuit coupled to the differential amplifier; and a hysteresis control circuit coupled to the differential amplifier and the common mode voltage tracking circuit, wherein the hysteresis control circuit controls hysteresis of the differential amplifier independently of the common mode voltage at the differential inputs of the differential amplifier.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Figure 1:
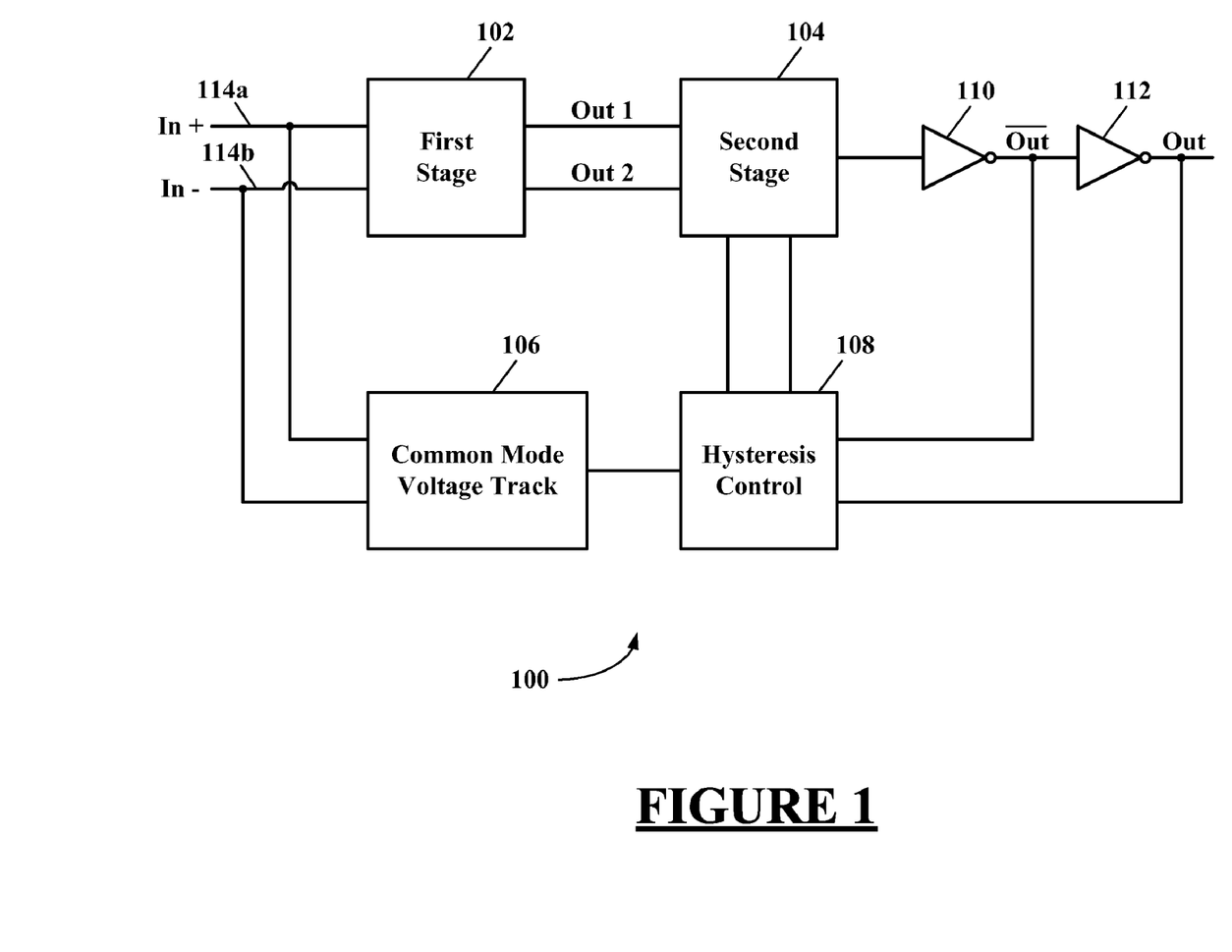
FIG. 1 illustrates a schematic block diagram of a two stage rail-rail comparator, according to a specific example embodiment of this disclosure.

Referring to FIG. 1, depicted is a schematic block diagram of a two stage rail-rail comparator, according to a specific example embodiment of this disclosure. A two stage rail-rail comparator, generally represented by the numeral 100, comprises a first stage 102, a second stage 104, common mode voltage tracking circuit 106 and hysteresis control 108. The first stage 102 has differential inputs 114 connected to differential input pairs (FIG. 2) feeding current into diode connected loads. The second stage 104 receives a differential output signal (Out 1 and Out 2) from the first stage 102 and amplifies this output signal enough to drive inverter gate 110 which in turn drives inverter gate 112. Offset calibration is implemented as a source degeneration resistor ladder in each of the N-channel and P-channel differential pairs (FIG. 2) of the first stage 102. Tail current is taken through a multiplexer so that series resistance of switches in the multiplexer do not affect the offset calibrations. Hysteresis is implemented in the second stage 104 by adding a fraction of the tail current as positive feedback current to the differential pair of the second stage 104. Symmetry of the hysteresis is assured since the same current is routed through the multiplexer depending upon the logic states of the inverter gates 110 and 112 (dependant upon the output logic state of the second stage 104). The hysteresis current tracks the Gm (transconductance) variation of the first stage 102 with the common mode voltage tracking circuit 106. This allows the hysteresis of the second stage 104 to be substantially insensitive to the value of the input common mode voltage at the differential inputs 114.

Figure 2:
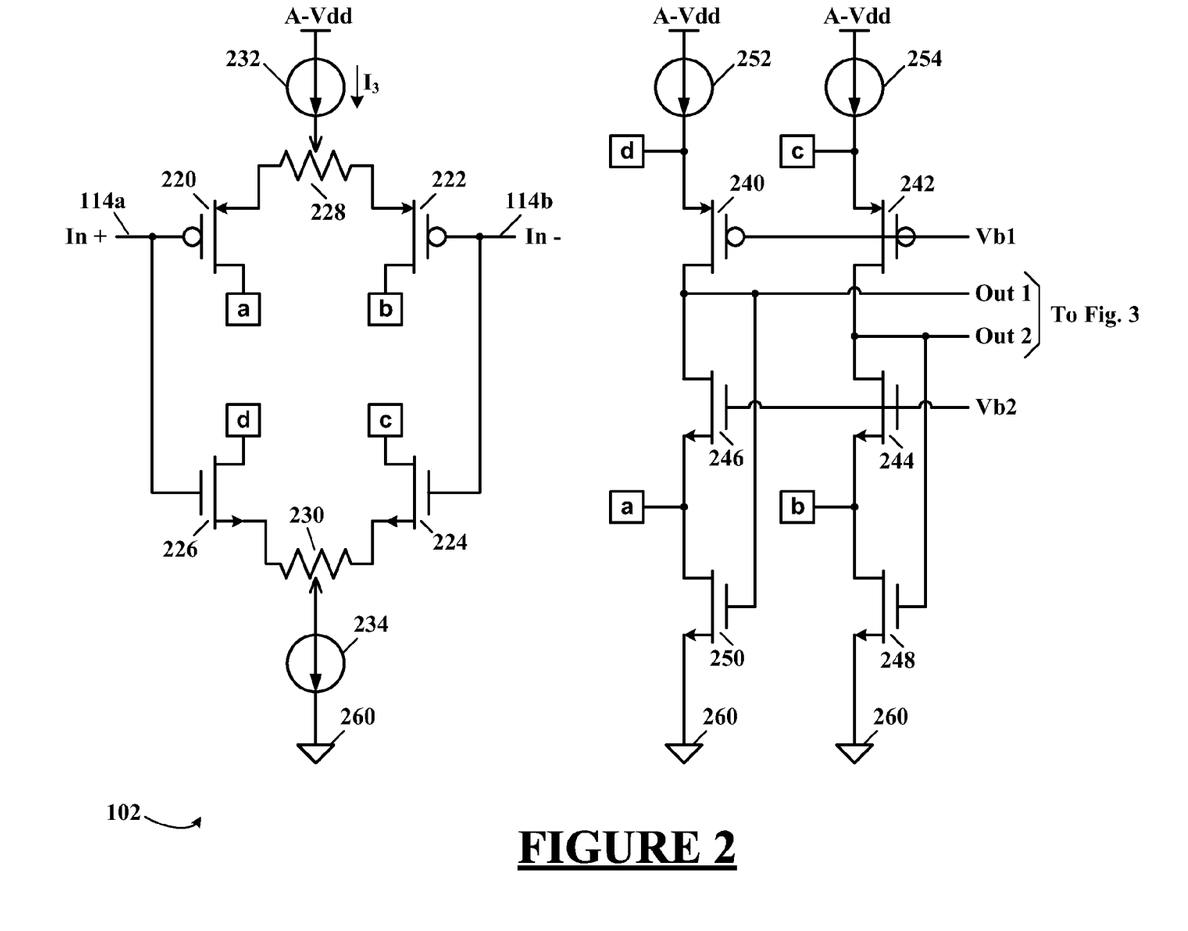
FIG. 2 illustrates a more detailed schematic diagram of the first stage of the two stage rail-rail comparator of FIG. 1.

Referring to FIG. 2, depicted is a more detailed schematic diagram of the first stage of the two stage rail-rail comparator of FIG. 1. The first stage 102 comprises a low-gain, e.g., unity gain, stage having P-channel transistors, e.g., metal oxide semiconductor (MOS) transistors, 220 and 222 operable for the lower half of the input common mode voltage range and N-channel transistors, e.g., metal oxide semiconductor (MOS) transistors, 224 and 226 operable for the upper half of the input common mode voltage range. There is an overlap region where the pairs of the P-channel transistors 220 and 222 and the N-channel transistors 224 and 226 are both operational.

Offset calibrations may be implemented with an adjustable resistor network 228 between the sources of the P-channel transistors 220 and 222, and an adjustable resistor network 230 between the sources of the N-channel transistors 224 and 226. Since the adjustable resistor network 228 is used for the pair of P-channel transistors 220 and 222, and the adjustable resistor network 230 is used for the pair of N-channel transistors 224 and 226, each one of the adjustable resistor networks 228 and 230 will independently zero-out offset contributions from the input pairs (P-channel transistors 220 and 222, and N-channel transistors 224 and 226). Therefore, the common-mode dependency of the offset voltage can be corrected without any errors or interaction therebetween. Current source 232 is used in combination with the pair of P-channel transistors 220 and 222, and current source 234 is used in combination with the pair of N-channel transistors 224 and 226.

Figure 3:
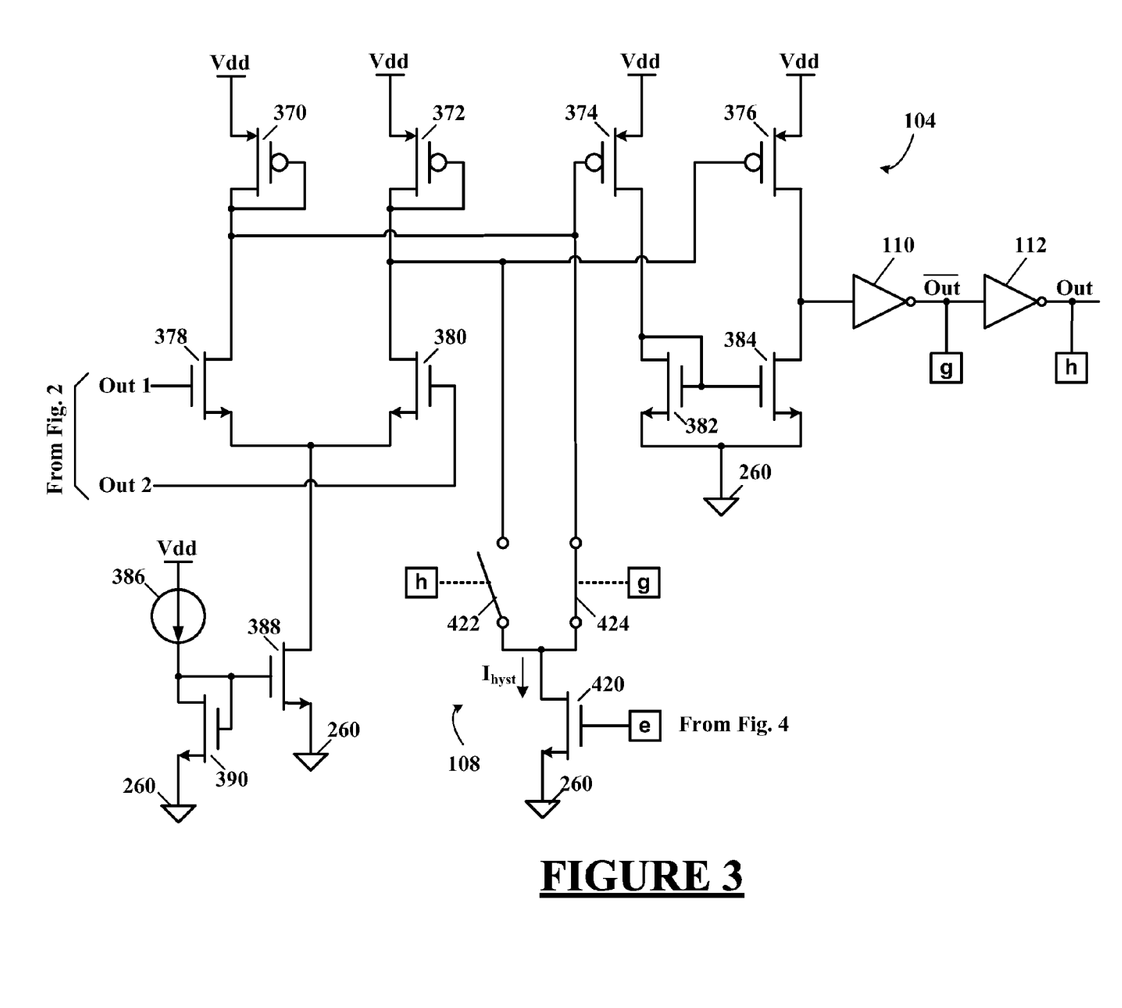
FIG. 3 illustrates a more detailed schematic diagram of the second stage and hysteresis control of the two stage rail-rail comparator of FIG. 1.

Referring to FIG. 3, depicted is a more detailed schematic diagram of the second stage of the two stage rail-rail comparator and hysteresis control of FIG. 1. The second stage 104 comprises input pair N-channel transistors, e.g., metal oxide semiconductor (MOS) transistors, 378 and 380, and differential input to single ended output P-channel transistors 374 and 376. The hysteresis is added to this second stage 104 with an N-channel transistor 420 that injects a hysteresis current, $I_{hyst}$, into the second stage 104 through either switch 422 or switch 424 configured as a multiplexer and controlled by the output states of the inverter gates 110 and 112. The hysteresis current, $I_{hyst}$, is a mirror image of a fraction of the tail current I coming from the circuit shown in FIG. 4.

Figure 4:
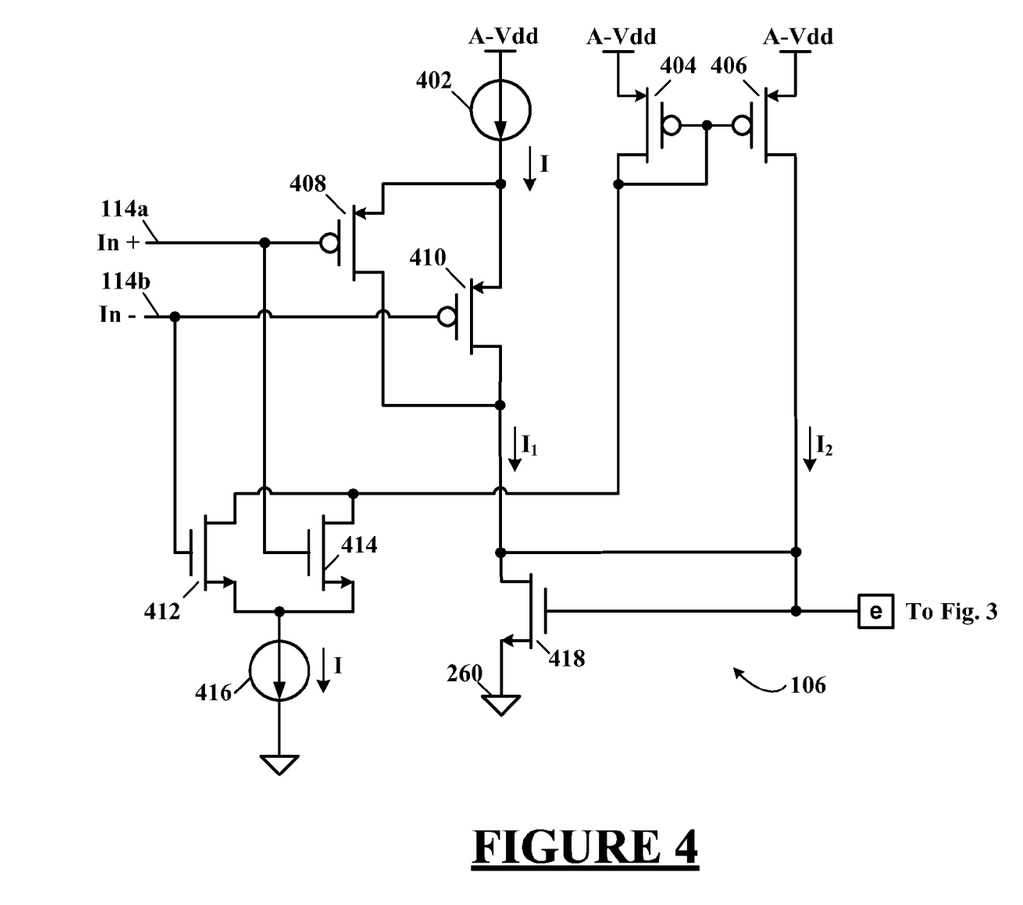
FIG. 4 illustrates a more detailed schematic diagram of the common mode voltage tracking circuit of the two stage rail-rail comparator of FIG. 1.

Referring to FIG. 4, depicted is a more detailed schematic diagram of the common mode voltage tracking circuit of the two stage rail-rail comparator of FIG. 1. The common mode voltage tracking circuit 106 comprises P-channel transistors 408 and 410 as one differential input pair, and N-channel transistors 412 and 414 as a second differential input pair. These two differential input pairs replicate operation of the input pairs of P-channel transistors 220 and 222, and N-channel transistors 224 and 226, respectively. The common mode voltage tracking circuit 106 supplies independent current generation to the hysteresis control 108 shown in FIG. 3. The hysteresis control 108 uses $I_2$ as positive feedback current to the differential input pair (N-channel transistors 378 and 380) of the second stage 104. Thus the hysteresis current, $I_{hyst}$, tracks the input stage 102 Gm (transconductance) with the common mode tracking current, $I_1+I_2$, of the common mode input pairs (P-channel transistors 220 and 222, and N-channel transistors 224 and 226) of the first stage 102.

Figure 5:
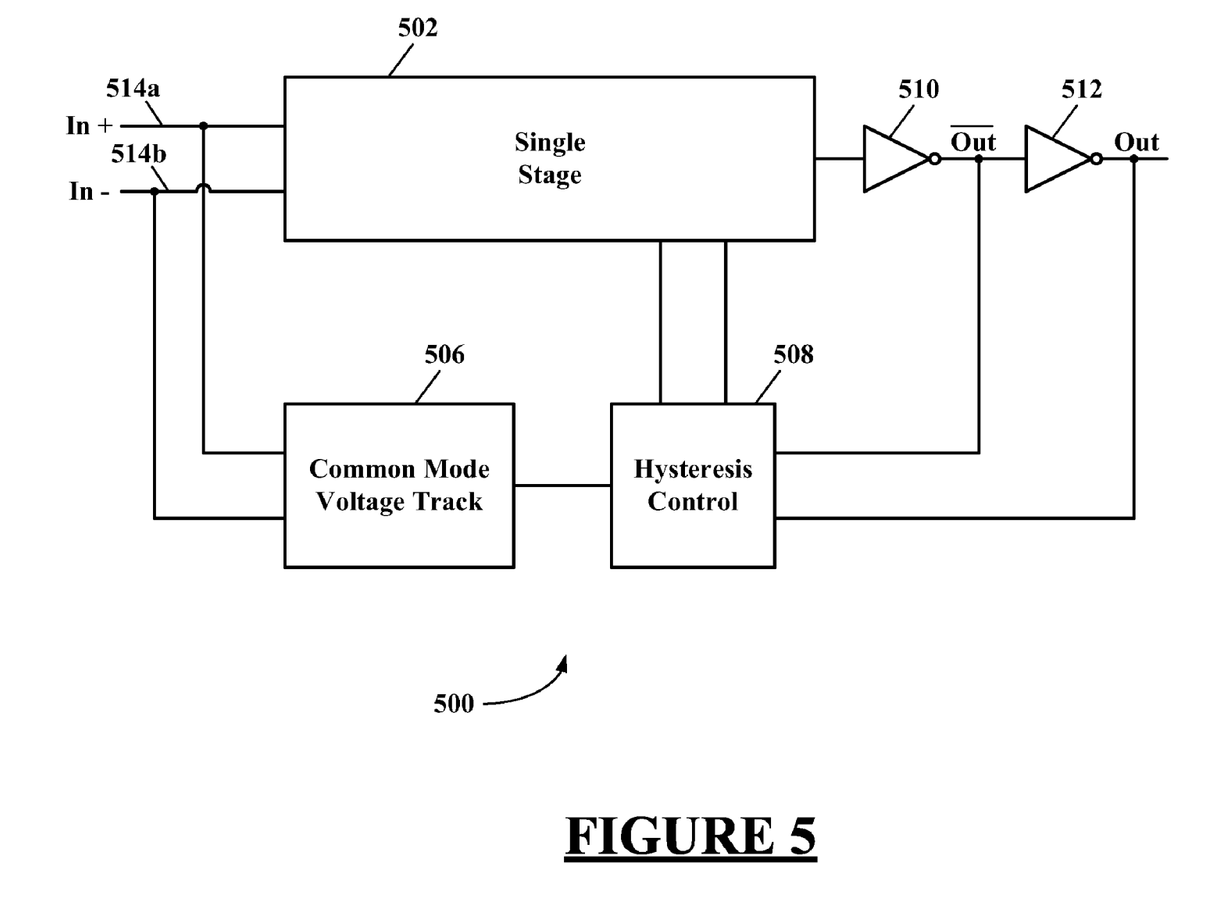
FIG. 5 illustrates a schematic block diagram of a single stage rail-rail comparator, according to another specific example embodiment of this disclosure.

Referring to FIG. 5, depicted is a schematic block diagram of a single stage rail-rail comparator, according to another specific example embodiment of this disclosure. A single stage rail-rail comparator, generally represented by the numeral 500, comprises a differential input single stage 502, a common mode voltage tracking circuit 506 and hysteresis control 508.

Figure 6:
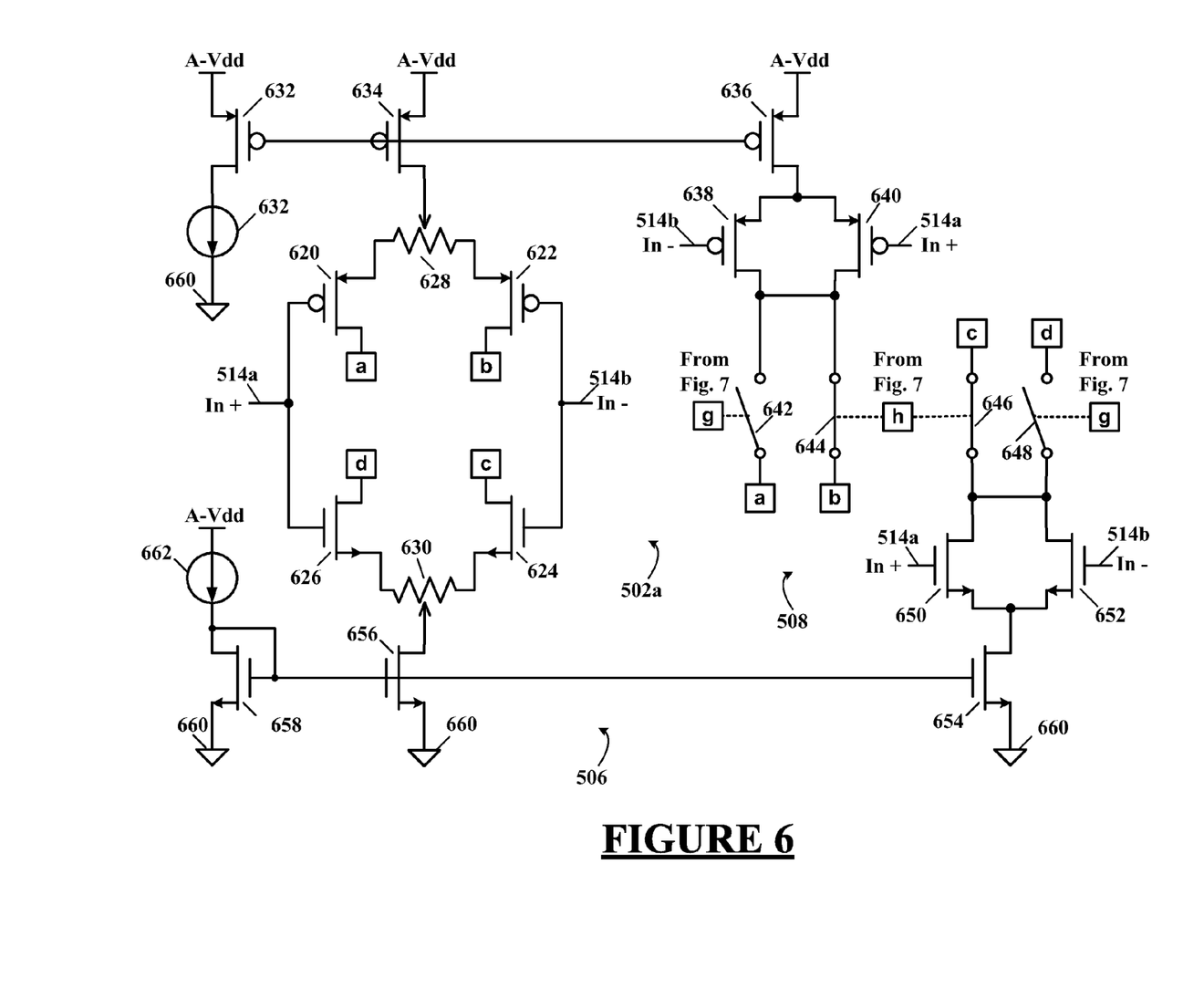
FIGS. 6 and 7 illustrate more detailed schematic diagrams of the single differential input stage, common mode voltage tracking circuit and hysteresis control of the single stage rail-rail comparator of FIG. 5.
Figure 7:
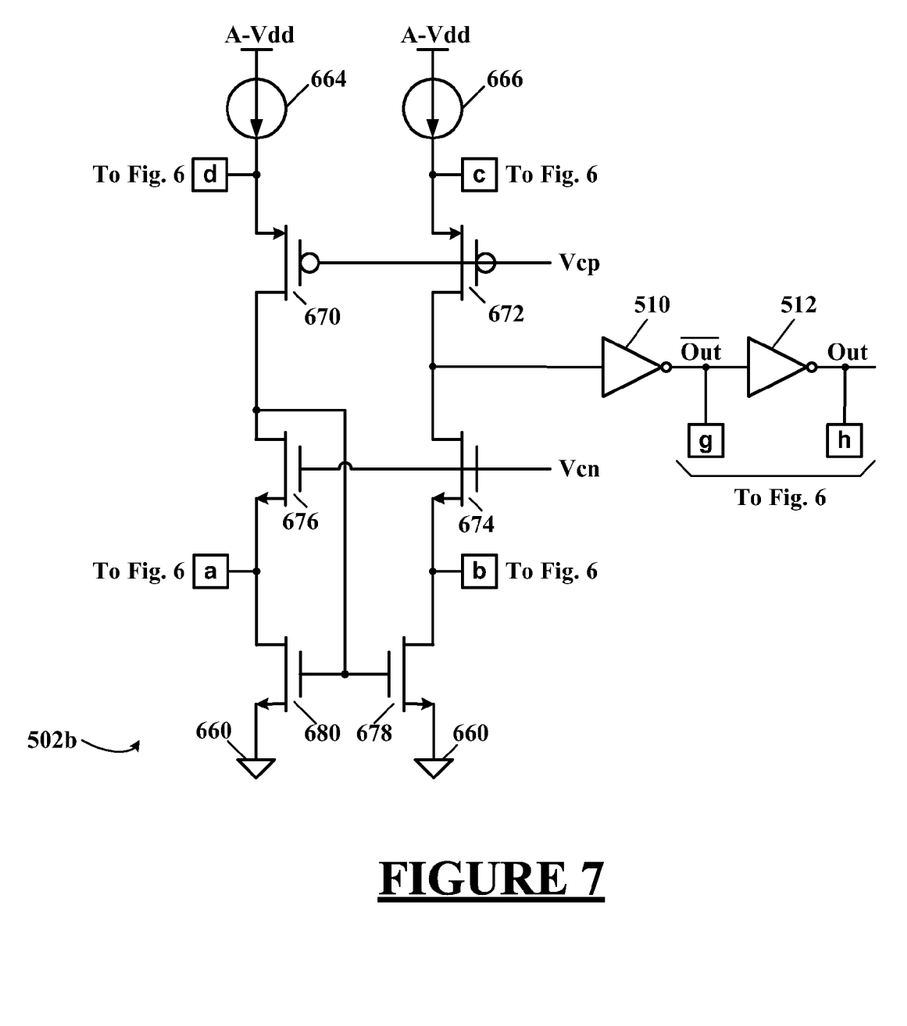

Referring to FIGS. 6 and 7, depicted are more detailed schematic diagrams of the differential input single stage, common mode voltage tracking circuit and hysteresis control of the single stage rail-rail comparator of FIG. 5. The differential input single stage 502 comprises having P-channel transistors, e.g., metal oxide semiconductor (MOS) transistors, 620 and 622 operable for the lower half of the input common mode voltage range and N-channel transistors, e.g., metal oxide semiconductor (MOS) transistors, 624 and 626 operable for the upper half of the input common mode voltage range. There is an overlap region where the pairs of the P-channel transistors 620 and 622 and the N-channel transistors 624 and 626 are both operational.

Offset calibrations may be implemented with an adjustable resistor network 628 between the sources of the P-channel transistors 620 and 622, and an adjustable resistor network 630 between the sources of the N-channel transistors 624 and 626. Since the adjustable resistor network 628 is used for the pair of P-channel transistors 620 and 622, and the adjustable resistor network 630 is used for the pair of N-channel transistors 624 and 626, each one of the adjustable resistor networks 628 and 630 will independently zero-out offset contributions from the input pairs (P-channel transistors 620 and 622, and N-channel transistors 624 and 626). Therefore, the common-mode dependency of the offset voltage cam be corrected without any errors or interaction therebetween. Current source 632 through current mirror transistor 634 is used in combination with the pair of P-channel transistors 620 and 622, and current source 662 through current mirror transistor 656 is used in combination with the pair of N-channel transistors 624 and 626.

Hysteresis is added to the single stage 502 with the hysteresis control 508. The hysteresis control 508 comprises differential input pair P-channel transistors 638 and 640, differential input pair N-channel transistors 650 and 652, multiplexer switches 642-648, and current mirror transistor 654. The current mirror transistor 654 follows the tail current through transistor 656, similar in operation of the two stage comparator 100 described hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:
1. A rail-rail comparator, comprising:
 a first stage differential amplifier having differential inputs and differential outputs, the first stage differential amplifier having common mode input offset calibration;
 a second stage differential amplifier having differential inputs coupled to the differential outputs of the first stage differential amplifier, and a digital output for supplying first and second logic levels dependant upon a value of a differential voltage at the differential inputs of the first stage differential amplifier;

a common mode voltage tracking circuit coupled to the first stage differential amplifier; and a hysteresis control circuit coupled to the second stage differential amplifier and the common mode voltage tracking circuit, wherein the hysteresis control circuit controls hysteresis of the second stage differential amplifier independently of the common mode voltage at the differential inputs of the first stage differential amplifier.

2. The rail-rail comparator according to claim 1, wherein the first stage differential amplifier comprises a P-channel transistor pair and an N-channel transistor pair, wherein the P-channel and N-channel transistor pairs have independent common mode input offset calibration adjustments.

3. The rail-rail comparator according to claim 2, wherein the independent common mode input offset calibration adjustments comprise a first offset calibration potentiometer connected between sources of the P-channel transistor pair and a second offset calibration potentiometer connected between sources of the N-channel transistor pair.

4. The rail-rail comparator according to claim 1, wherein the common mode voltage tracking circuit supplies a portion of a tail current of the first stage differential amplifier to the hysteresis control circuit, whereby the hysteresis control circuit tracks transconductance of the first stage differential amplifier to provide the independent hysteresis of the second stage differential amplifier.

5. The rail-rail comparator according to claim 4, wherein the hysteresis control circuit uses the portion of the tail current as positive feedback current to a differential input transistor pair of the second stage differential amplifier.

6. The rail-rail comparator according to claim 5, wherein the portion of the tail current is supplied to the second stage differential amplifier through a pair of multiplexer switches, the pair of multiplexer switches being controlled by the output logic states of the second stage differential amplifier.

7. A rail-rail comparator, comprising:
a differential amplifier having differential inputs and a digital output for supplying first and second logic levels dependant upon a value of a differential voltage at the differential inputs of the differential amplifier, the differential amplifier having common mode input offset calibration;

a common mode voltage tracking circuit coupled to the differential amplifier; and a hysteresis control circuit coupled to the differential amplifier and the common mode voltage tracking circuit, wherein the hysteresis control circuit controls hysteresis of the differential amplifier independently of the common mode voltage at the differential inputs of the differential amplifier.

8. The rail-rail comparator according to claim 7, wherein the differential amplifier comprises a P-channel transistor pair and an N-channel transistor pair, wherein the P-channel and N-channel transistor pairs have independent common mode input offset calibration adjustments.

9. The rail-rail comparator according to claim 8, wherein the independent common mode input offset calibration adjustments comprise a first offset calibration potentiometer connected between sources of the P-channel transistor pair and a second offset calibration potentiometer connected between sources of the N-channel transistor pair.

10. The rail-rail comparator according to claim 7, wherein the common mode voltage tracking circuit supplies a portion of a tail current of the differential amplifier to the hysteresis control circuit, whereby the hysteresis control circuit tracks transconductance of the differential amplifier to provide the independent hysteresis of the differential amplifier.

11. The rail-rail comparator according to claim 10, wherein the hysteresis control circuit uses the portion of the tail current as positive feedback current to another differential input transistor pair of the differential amplifier.

12. The rail-rail comparator according to claim 11, wherein the portion of the tail current is supplied to the differential amplifier through pairs of multiplexer switches, the pairs of multiplexer switches being controlled by the output logic states of the differential amplifier.

* * * * *